United States Patent [19]

Hongo et al.

[11] Patent Number: 5,182,231

[45] Date of Patent: * Jan. 26, 1993

[54] METHOD FOR MODIFYING WIRING OF SEMICONDUCTOR DEVICE

[75] Inventors: Mikio Hongo; Katsuro Mizukoshi; Shyuzo Sano; Takashi Kamimura, all of Yokohama; Takahiko Takahashi, Iruma, all of Japan

[73] Assignee: Hitachi, Ltd., Tokyo, Japan

[*] Notice: The portion of the term of this patent subsequent to Jun. 25, 2008 has been disclaimed.

[21] Appl. No.: 528,064

[22] Filed: May 23, 1990

Related U.S. Application Data

[63] Continuation-in-part of Ser. No. 334,145, Apr. 6, 1989, Pat. No. 5,026,664.

[30] Foreign Application Priority Data

May 29, 1989 [JP] Japan .................. 1-132601

[51] Int. Cl.$^5$ ............................. H01L 21/26
[52] U.S. Cl. ..................... 437/173; 437/174; 437/190
[58] Field of Search .......... 437/173, 174, 190

[56] References Cited

U.S. PATENT DOCUMENTS

| | | |
|---|---|---|
| 3,785,862 | 1/1974 | Grill . |
| 4,602,420 | 7/1986 | Saito .................... 437/173 |
| 4,609,809 | 9/1986 | Yamaguchi et al. ...... 4,503,329/Yamaguchi et al. |
| 4,795,720 | 1/1989 | Kawanabe ............ 437/922 |
| 4,868,068 | 9/1989 | Yamaguchi et al. . |
| 5,026,664 | 6/1991 | Hongo et al. ........... 437/173 |

FOREIGN PATENT DOCUMENTS

| | | |
|---|---|---|
| 22650 | 1/1986 | Japan . |
| 229956 | 10/1987 | Japan . |
| 229957 | 10/1987 | Japan . |
| 100746 | 5/1988 | Japan . |
| 164240 | 7/1988 | Japan . |
| 257351 | 10/1989 | Japan . |

OTHER PUBLICATIONS

Semiconductor World, Nov. 1987, pp. 27-32, (Provided in Japanese-English translation unavailable).
Fumihiko Uesugi, et al., "Direct Writing of Highly Conductive Mo Lines by Laser Induced CVD", Extended Abstracts of the 17th Conference on Solid State Devices and Materials, Tokyo, 1985, pp. 193-196.
Extended Abstracts, (The 49th Autumn Meeting), The Japan Society of Applied Physics, Oct. 1988, p. 534. (Provided in Japanese-English translation unavailable).
E. K. Broadbent "Nucleation and growth of chemically vapor deposited tungsten on various substrate materials; A review" J. Vac. Sci. Tech. B5(6), Nov./Dec. 1987, pp. 1661-1666.
IBM, TDB vol. 31, #3, Aug. 1988, pp. 477-478, "Tungsten-on Conducting Nitride Composite Films".
Y. Pauleau, "Interconnect Materials for VLSI Circuits" Solid State Technology/Apr. 1987, pp. 155-162.

*Primary Examiner*—Brian E. Hearn
*Assistant Examiner*—Linda J. Fleck
*Attorney, Agent, or Firm*—Fay, Sharpe, Beall, Fagan, Minnich & McKee

[57] ABSTRACT

The wiring of a semiconductor device having a multilayer interconnection on a semiconductor substrate is modified. A plurality of fine holes are formed on an insulation film by the radiation of a converged energy beam to expose selected ones of the internal lines of the underlying wiring. A thin buffer film of Cr, Ti, TiN, or W is formed along a path where an additional connection line is to be deposited. The path extends along an upper surface of the insulating film at least in and between the said fine holes. The additional connection line is deposited on the buffer film by energy beam CVD, using Mo, W, or Al, to interconnect the exposed internal lines. The additional connection line is annealed by radiating an energy beam thereon to reduce its resistance. A further insulating film is deposited covering the additional connection line by energy beam CVD.

19 Claims, 14 Drawing Sheets

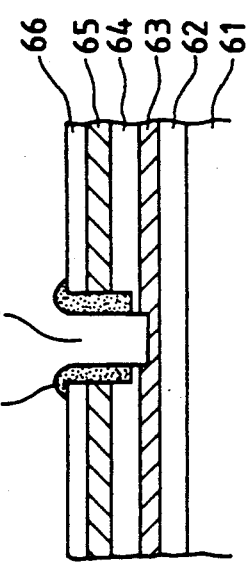
FIG. 8(a)
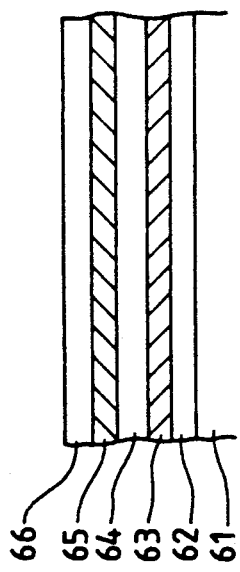
FIG. 8(b)
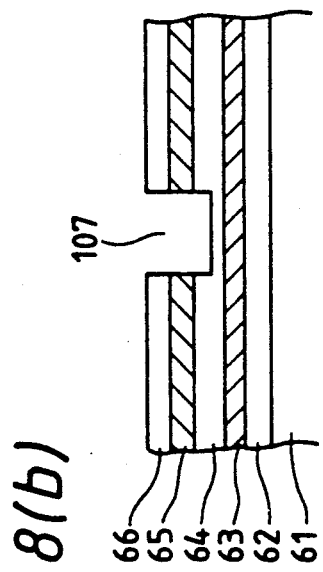
FIG. 8(d)
FIG. 8(e)
FIG. 8(c)
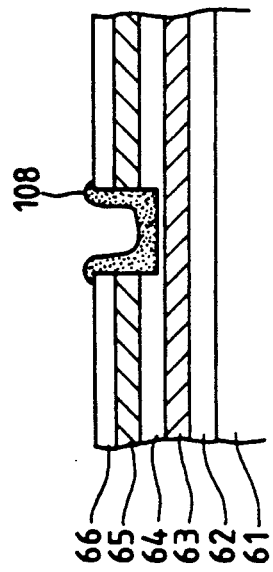
FIG. 8(f)
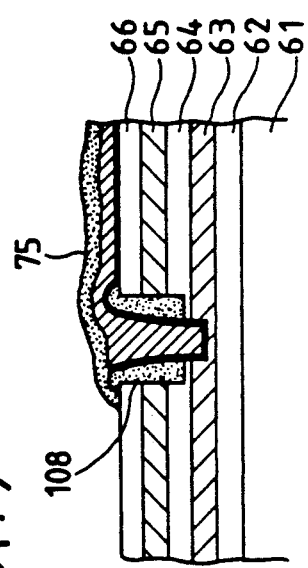

RELATION BETWEEN A LASER BEAM POWER AND A SPECIFIC ELECTRIC RESISTANCE OF A Mo ADDED-CONNECTIVE WIRING a) ELEMENT ANALYSIS BY AES b) STRUCTURE ANALYSIS BY X-RAY DIFFRACTION a) ELEMENT ANALYSIS BY AES b) STRUCTURE ANALYSIS BY X-RAY DIFFRACTION

METHOD FOR MODIFYING WIRING OF SEMICONDUCTOR DEVICE

This application is a continuation-in-part of U.S. application Ser. No. 07/334,145, filed Apr. 6, 1989, now U.S. Pat. No. 5,026,664.

BACKGROUND OF THE INVENTION

The present invention relates to a method and an apparatus for wiring the surface of a semiconductor device and also relates to a semiconductor device having wiring formed by the said method and apparatus. In particular, the present invention is concerned with a wiring modifying method and an apparatus suitable for specifying a defective portion present partially in a semiconductor device manufactured for trial, also suitable for specifying a cause of the defect, or repair of the defect, and is further concerned with a semiconductor device.

Semiconductor devices are becoming finer and finer in structure and high in integration for grade-up and speed-up purposes. Accordingly, the development of a semiconductor device more and more difficult, resulting in a longer period required for such development. This situation indicates that the circuit manufacturing technique of "cut and try" is necessary also in the design of LSI. If a semiconductor device, which affords complete operations temporarily, is obtained by specifying a defective portion on a chip which does not fully operate in a conventional design, by cutting the line present in that defective portion, or forming a line in a desired part, or repairing a defective wiring, then the subsequent evaluation of characteristics and alteration of design can be performed rapidly and it becomes possible to deliver such semiconductor devices as technical samples.

As the prior art, for example as described on pages 27 to 32 of "Semiconductor World" November 1987 number, there has been introduced a method in which holes are formed in the surface passivation and an inter-layer insulating film of an LSI chip by the use of a focused ion beam (FIB) to expose wiring portions, then CVD gas is introduced and metallic wiring is formed also by the use of FIB.

Also, there has been introduced a method in which molybdenum wiring is formed on a silicon base coated with SiO₂ using the laser CVD technique, as described in Extended Abstracts of the 17th Conference on Solid State Devices and Materials, Tokyo, (1985), pp. 193-196.

Further known as prior art are U.S. Pat. Nos. 4,868,068; 4,503,329; and 4,609,809, Japanese Patent Laid Open No. 229957/87, and "Extended Abstracts (the 49th Autumn Meeting, 1988) the Japan Society of Applied Physics", (October 1988), p. 534.

According to the above first conventional technique, or by combination of the first conventional technique with the second also referred to above, it is possible to cut unnecessary wiring or form additional wiring, whereby it is possible to repair an LSI chip which does not operate due to defective design or defective process and obtain an LSI chip now capable of operating in a satisfactory manner. However, there still remains the problem that the LSI chip thus obtained is not fully reliable.

SUMMARY OF THE INVENTION

It is the object of the present invention to provide a highly reliable, wiring modifying method and apparatus of high reliability which cuts a desired line on a semiconductor device, forms a line of certain thickness and width superior in adhesion, make connection of a low resistance in a connected portion, specifier defective portions of the semiconductor device, repairs such defective portions, thereby evaluate characteristics, effect speed-up of the change of design, and permit shipping of repaired LSIs, and also provide a semiconductor device.

More specifically, according to one aspect of the present invention there is provided a semiconductor device in which at least end faces of an internal line exposed by cutting are covered with an insulating film to prevent short-circuit caused by migration.

According to another aspect of the present invention there is provided a semiconductor device in which there is formed an additional line for connecting internal lines with each other, and at least the said additional line is covered with an insulating film.

According to a further aspect of the present invention there is provided a method for modifying the wiring of a semiconductor device which method comprises forming an electroconductive buffer film on a path on which is to be formed at least a connection line, then forming the connection line thereon selectively with a energy beam CVD, thereafter removing the unnecessary buffer film portion, and annealing the said connection line by the radiation of energy beam.

According to a further aspect of the present invention there is provided a method for modifying the wiring of a semiconductor device, which method comprises the steps of forming a connection hole in a desired portion of the semiconductor device by the radiation energy beam; forming an electroconductive buffer film on a path on which is to be formed at least a connection line; forming the connection line on the semiconductor device; removing the unnecessary buffer film portion; radiating an energy beam to the said connection line in a vacuum or in an inert gas or reducing gas atmosphere; and forming an insulating film on the connection line with a energy beam CVD, thus cutting and connecting the wiring of the semiconductor device.

According to a still further aspect of the present invention there is provided an apparatus for modifying wiring of a semiconductor device, comprising a stage for resting the semiconductor device thereon; a chamber for maintaining the semiconductor device in a specific atmosphere; means for exhausting the interior of the said chamber; means for feeding a material gas for forming an electroconductive substance; means for feeding a material gas for forming an insulating substance; means for generating an energy beam to decompose the said material gases for the formation of the electroconductive substance and the insulating substance; an optical system for converging and radiating the said energy beam onto the surface of the semiconductor device in the said chamber; and an optical system for the observation of the chip surface.

The first subject can be overcome by embedding, for example, SiO₂ in the hole formed by the cutting of the line; the second and third subjects can be overcome by forming, for example, SiO₂ film on the line formed; and the fourth subject can be overcome by forming a through hole in an upper line, then embedding, say, SiO$_2$ therein, then forming a connection hole in a lower line, and thereafter making connection.

The LSI chip which has gone through the cutting or line forming step placed in an atmosphere of tetraethyl orthosilicate and ozone. The interior of the cutting hole can be filled up with SiO$_2$ by the radiation of laser beam [or focused ion beam (FIB)]. SiO$_2$ film can be formed on only the wiring by the scanning of laser beam from the start to the end point of the wiring path. The foregoing subjects can be overcome by repeating as necessary the cutting of line, forming of line, and local film formation of SiO$_2$ (including embedding thereof into the hole), and the reliability of the modified LSI can be ensured thereby.

Thus, according to the present invention, since the end faces of aluminum line in a cut portion thereof are not exposed, there is no fear of short-circuit caused by electromigration of aluminum. Moreover, since a connection line formed by focused ion beam chemical vapor deposition (FIBCVD) or laser CVD is not exposed, there is no fear of disconnection caused by the application of a mechanical force thereto during assembly or by heating in the air. Even in the event of crossing of connection lines, it is possible to correct it. Further, even when a lower line is to be connected with another line in a portion where the lower line is overlapped with an upper line, it is possible to prevent short-circuiting of both lines. In this way the reliability of the semiconductor device after the modification of wiring can be improved.

Thus, the present invention is characterized in that, in the formation of a line of Mo, W, Al, etc., there is formed a buffer film such as Cr, Ti, W, or TiN film for the purpose of improving the adhesion to the chip surface, preventing the transmission of laser light to a lower layer and the reduction of power in film formation. After the formation of a line by laser CVD, the line is subjected to laser-annealing for reducing the resistance of the line. The present invention is further characterized by forming an insulating film (protective film) simultaneously with the laser-annealing.

Brief Description of the Drawings

FIGS. 8(a) to (f), FIGS. 9(a) to (c) and FIG. 10 are each an explanatory view of a method for modifying wiring of a semiconductor integrated circuit according to another embodiment of the present invention;

DETAILED DESCRIPTION OF THE PREFERRED EMBODIMENTS

Embodiments of the present invention will be described hereinunder with reference to the accompanying drawings.

Figure 1:
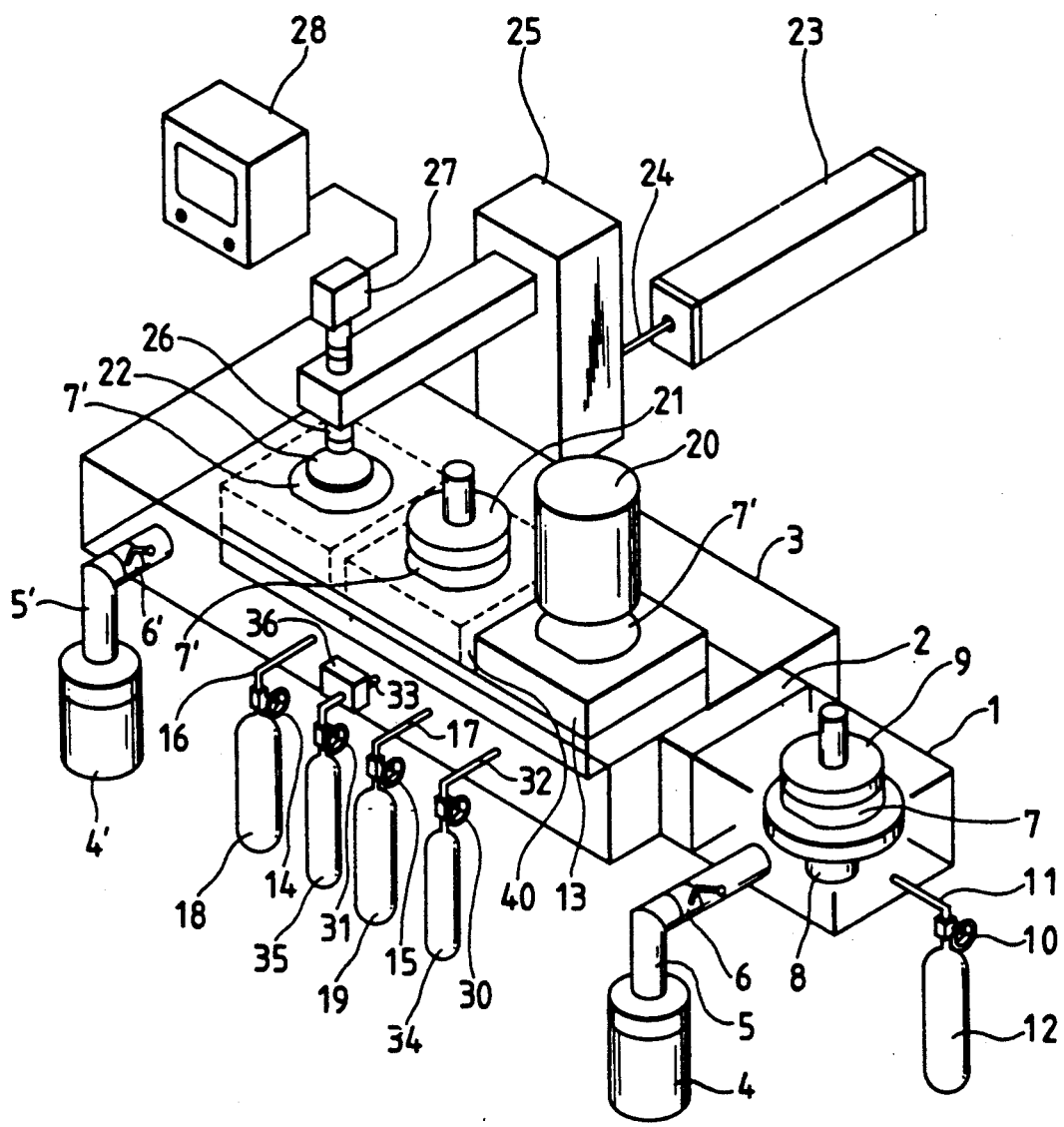
FIG. 1 is a construction diagram of an apparatus for modifying wiring of a semiconductor integrated circuit according to an embodiment of the present invention.

FIG. 1 illustrates an entire construction of a wiring apparatus according to an embodiment of the present invention. As shown in the same figure, a load lock chamber 1 is connected to a main chamber 3 through a gate valve 2. Both chambers 1 and 3 can be exhausted through vacuum pumps 4, 4′, pipes 5, 5′ and valves 6, 6′. In the load lock chamber 1 there are provided a sample rest 8 for resting a wafer 7 (or a chip if necessary) thereon and an upper electrode 9, and the load lock chamber is connected to an argon (Ar) gas cylinder 12 through a flow rate adjusting valve 10 and a pipe 11.

In the main chamber 3 there is mounted a stage 13 capable of moving in the direction of X-Y-Z-$\theta$ while resting a wafer 7′ thereon, and the chamber 3 is connected to a wiring CVD feed gas cylinder 18, an Ar gas cylinder 19, an insulating film CVD feed gas cylinder 34 and an oxygen gas (O$_2$) cylinder 35 through flow rate adjusting valves 14, 15, 30, 31 and further through pipes 16, 17, 32, 33. In an intermediate position of the pipe 33 there is provided an ozonizer 36. Further provided in the main chamber 3 is an optical system 20 using ion beam which converges a metal ion emitted from a liquid metal ion source for example into a fine spot and allows the fine ion spot to scan a certain area to effect sputtering. Also, an upper sputtering electrode 21 having a sputtering target is provided in the main chamber 3. Further, there is provided a laser beam transmitting window 22, through which a laser beam 24 emitted from an Ar ion laser beam generator 23 passes through an optical system 25 and then is converged by an objective lens 26 and radiated to the wafer 7′. A TV camera 27 is attached to the laser optical system 25, and the surface of the wafer 7′ can be observed by a monitor 28.

Figure 20:
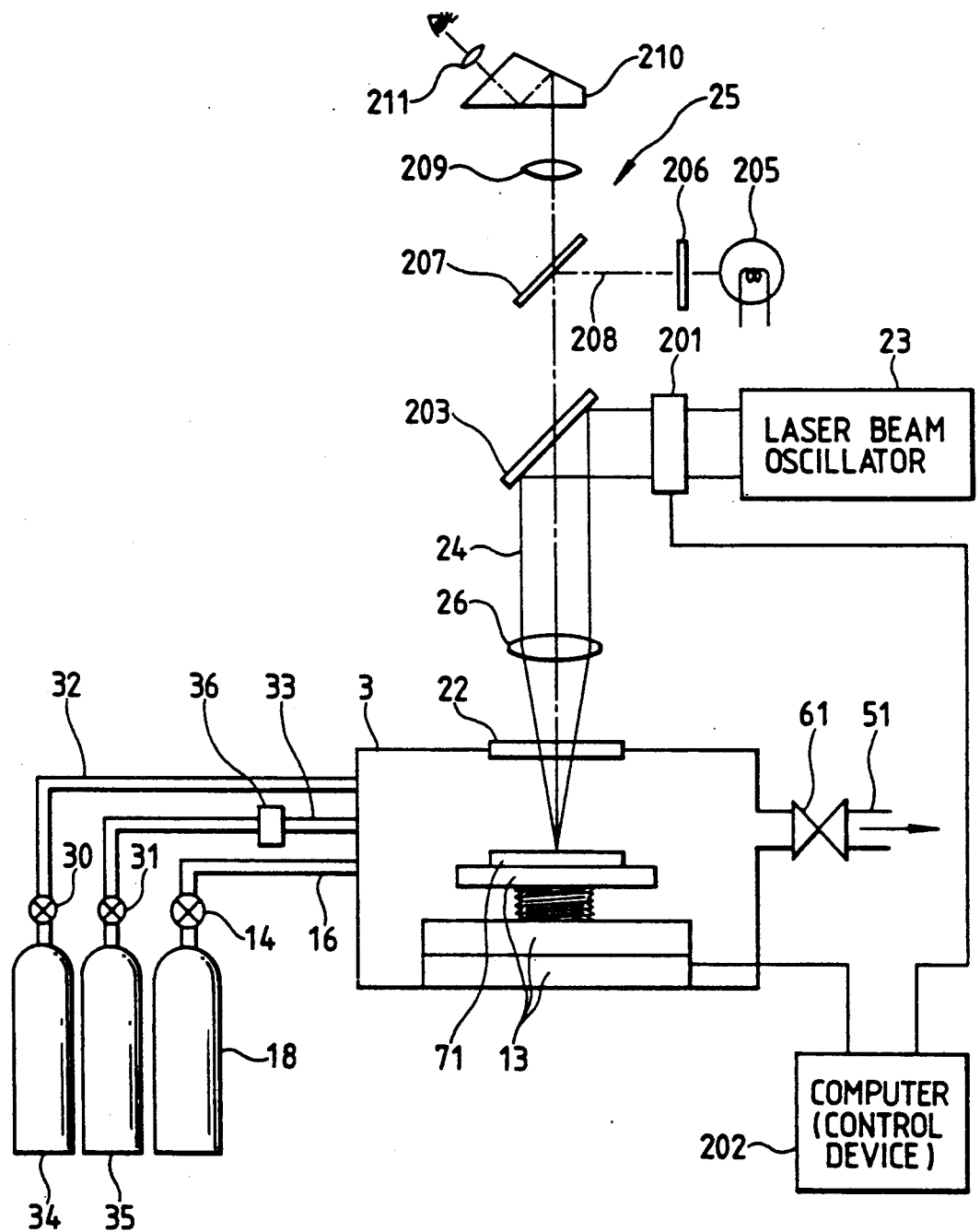
FIG. 20 is a view concretely showing an example of a laser CVD system portion according to the present invention.

Referring now to FIG. 20, there is illustrated an example of a concrete construction of a laser CVD system portion. The laser CVD system includes a processing optical system comprising a laser beam generator 23 for emitting laser beam 24, a dichroic mirror 203 for reflecting the laser beam 24 and conducting it to the sample 71, and an objective lens 26 for converging the laser beam 24 and radiating the converged laser beam onto the sample 71; an observational optical system 25 comprising an observational light source 205, a filter 206 for extracting an observational light of a wave length close to that of the laser beam 24, a half mirror 207 for conducting the observational light 208 onto the sample 71, a focusing lens 209 for forming an image of the sample 71, a prism 210 and an eyepiece 211; a gas feed/discharge system comprising gas feed pipes 16, 33, 32 connected to CVD material gas cylinders 18, 34, 35 through valves 14, 31, 30, and an exhaust pipe 5' connected to a vacuum exhauster 4' through a valve 6' (shown in FIG. 1); the chamber 3 which contains the sample 7' for CVD therein and has a window 22 for the introduction of laser beam 24 and also has a sample position specifying means, the sample position specifying means comprising a Z stage 13 for moving the sample 71 thereon in an optical axis direction for focusing with the laser beam 24 and the observational light beam 208 and an XY stage 13 for moving the sample 71 in a plane perpendicular to the optical axis; and a computer 202 for controlling the operation of the Z stage 13 and the XY stage 13 and the operation of a shutter 201 which functions to open and close the optical path of the laser beam 24.

The following description is now provided about the function of each component and the wiring forming procedure according to the present invention.

The wafer 7 in FIG. 1 on which wiring is to be formed or an unnecessary wiring portion is to be cut is placed on the sample rest 8 in the load lock chamber 1, and after hermetic seal of the same chamber, the valve 6 is opened and the interior of the chamber 1 is exhausted to $1 \times 10^{-7}$ Torr or less by means of the vacuum pump 4. At this time, a vacuum degree of $1 \times 10^{-5}$ Torr is allowable as the case may be.

Thereafter, the flow rate adjusting valve 10 is opened to introduce Ar gas from the Ar gas cylinder 12 into the load lock chamber 1, while the valve 10 is adjusted to obtain an Ar gas pressure of several mTorr. In this state, a high frequency power is applied to the sample rest 8 from a high-frequency power source (not shown). At this time, the upper electrode 9 is held at ground. As a result, Ar plasma is generated between the sample rest 8, wafer 7 and the upper electrode 9, and Ar$^+$ ion causes sputtering on the surface of the wafer 7, whereby contamination sources (moisture, dust, stain) on the wafer surface are removed.

Thereafter, the application of the high-frequency power is stopped and the valve 10 is closed, while the valve 6 is opened, to discharge the Ar gas from the load lock chamber 1. Then, the gate valve 2 is opened and the wafer 7 is placed onto the X-Y-Z-$\theta$ stage 13 in the main chamber 3 by means of a conveyance mechanism (not shown). At this time, the interior of the main chamber 3 is held in a vacuum as high as $1 \times 10^{-7}$ or so.

The wafer 7' is moved to the position just under the laser beam transmitting window 22 by the stage 13, at which there is made an adjustment in the Z and $\theta$ directions under observation through the objective lens 26, TV camera 27 and monitor 28. Thereafter, positioning is made with respect to a reference position (a target mark or a specific part of the chip) of the chip on which wiring is to be formed, and the stage 13 is moved to the position just under the ion beam optical system 20. Although a preliminary positioning was performed by means of the laser optical system 25, objective lens 26, TV camera 27 and monitor 28, it is not always limited to this way of positioning. The preliminary positioning may be conducted under observation of a scan ion microscopic image through the ion beam optical system 20.

Figure 2:
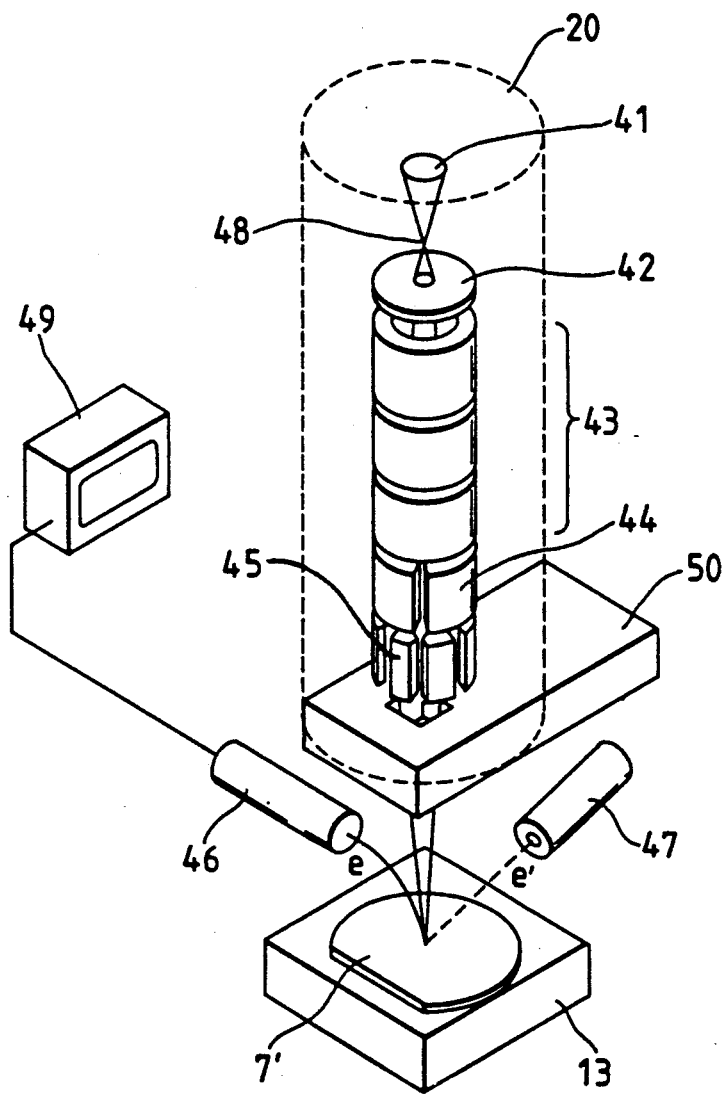
FIG. 2 is a block diagram of an optical system using ion beam which optical system is used in the apparatus of FIG. 1.

As shown in FIG. 2, the ion beam optical system 20 comprises an ion source (e.g. a liquid metal ion source such as Ga) 41, a lead-out electrode 42 disposed under the ion source 41, an electrostatic lens 43, a blanking electrode 44, a deflector electrode 45, a secondary electron detector 46, and an electron shower Upon application of a high voltage to the leadout electrode, a metal ion beam 48 (Ga ion when the ion source is a Ga ion source) is emitted from the ion source 41, then converged to 0.1–0.5 μm in diameter by the electrostatic lens 43 and radiated onto the wafer 7'. At this time, sputtering is performed for a certain area by scanning the ion beam 48 with the deflector electrode 45. Further, a signal obtained from the secondary electron detector 46 is displayed on a monitor 49 in synchronism with a signal applied to the deflector electrode 45, whereby the surface of the wafer 7' can be observed through the displayed image as a scan ion microscopic image. The electron shower 47 is for preventing the chip (wafer) surface from being positively charged by the ion beam 48. A heat source for the ion source 41 as well as power sources for the electrodes 42, 44, 45, electrostatic lens 43 and electron shower 47 are not shown in the drawings. Under observation of the scan ion microscopic image on the monitor 49, the reference position of the chip is made coincident with the optical axis of the ion optical system 20 for example. Thereafter, the stage 13 is moved to a line position to be cut or to be connected in accordance with design data. At this time, the ion beam 48 is bent by the blanking electrode 44 so it does not reach the upper surface of the chip.

When the said movement is over, a scanning area is set wider than the line width in the case of cutting (provided in a range preventing radiation to a line adjacent thereto) about the optical axis free of deflection, while in the case of line connection a scanning area is set about the same as the line width, followed by radiation of the ion beam 48 for a time required. The ion beam radiation time can be set by measuring the processing time in advance, or by using means which monitors the processing depth. By repeating the processing with the ion beam 48 and the movement of the stage 13 there is completed a required line cutting and window forming to the line for connection. Although the observation utilizing secondary electrons under radiation of ion beam has been described in this embodiment, an observation which utilizes secondary ions can also be made at the same time. In particular, the method utilizing secondary ions is effective as means for monitoring the processing depth. But a further reference thereto will not be made here.

Then, as shown in FIG. 1, the stage 13 is moved to the position just under the sputtering electrode 21. In the opening portion through which the ion beam 48 is radiated into the main chamber 3, there is provided a gate valve 40, which is closed upon completion of the ion beam radiation to maintain the ion beam optical system 20 in vacuo. Ar gas is introduced into the main chamber 13 through the flow rate adjusting valve 15 (FIG. 1) and the pipe 17, and adjustment is made by the valve 15 to give an Ar gas pressure of several mToor. The sputtering electrode 21 is provided with a Cr target, to which is applied a high-frequency power to maintain the stage 13 at ground. Ar+ ions in Ar plasma generated by the application of the high-frequency power sputters the Cr target, whereby Cr atoms are emitted and adhere to the surface of the wafer 7'. In this way there can be formed a Cr film of several 100–1000 Å or so. A thickness of about 300 Å of this Cr film permits the film to serve effectively as a buffer film 82 (shown in FIG. 3(b) and FIG. 3(g)) and even when its thickness is made larger up to about 1 μm, the adhesion to the base layer (the surface of the semiconductor device) is satisfactory. Where it is necessary to remove the buffer layer in a later process, the thickness of the buffer film is determined depending on what degree in thickness the wiring film formed on the semiconductor device may be scraped off in a subsequent etching process.

It is not necessary to form the buffer film throughout the whole surface of the semiconductor device. The buffer film 82 may be formed only on portions where lines are to be formed, and thereabouts, through mask means.

In this embodiment the passivation film (e.g. $SiO_2$ film) is 1 to 2 μm in thickness and the Cr film as the buffer film 82 is 500 Å thick, so even if etching is applied rather strongly, there will be no influence on the characteristics of the semiconductor device. In addition to the Cr film, Ti, TiN, or W film is also employable as the buffer film 82.

If Mo target or Ti target is used in the upper electrode 9, there can be formed Mo or Ti film as the buffer film. In this case, it is necessary that the thickness of the Mo or Ti film be determined in the range of several 100 to 1000 Å according to what means is to be used in the subsequent etching process.

After formation of the buffer film, the valve 15 is closed and the interior of the main chamber 3 is exhausted up to $1 \times 10^{-7}$ Torr or so, and the stage 13 is moved to the position just under the window 22. Then, through the window 22, a certain position (e.g. the target mark) on the semiconductor device in which a line is to be formed and a marker (e.g. an intersecting point of electronic lines) on the monitor 28 are made coincident with each other, using the laser beam converging objective lens 26, TV camera 27 and monitor 28. Subsequently, the XY stage 13 is operated in accordance with a design size to render a portion requiring connection, i.e., a portion in which a window is formed in the passivation film, and if necessary, also in an interlayer insulating film and wiring is exposed, with the marker. This marker is located in a converged position of the laser beam 19 when radiated.

According to the laser CVD technique used in the present invention, the CVD material gas absorbed on the surface of the chip (wafer) and the CVD material gas floating near the position in which heat is generated by the application of the laser beam are decomposed and deposited by virtue of thermal energy generated in the laser beam radiated position.

The valve 14 is opened to introduce CVD gas from the CVD material gas cylinder 18 into the main chamber 3 through the pipe 16, and at the same time the valve 6' is closed to shut the CVD gas in the chamber at a certain pressure. In this embodiment, $Mo(CO)_6$ (molybdenum carbonyl) is used as the CVD gas and adjustment is made to give a pressure of 0.1 Torr or so. If necessary, the pressure may be increased up to near the atmospheric pressure by the introduction of an inert gas such as Ar or He. Since $Mo(CO)_6$ is a white solid at room temperature and its vapor pressure on sublimation is low, it is necessary to heat the cylinder 18, valve 14 and pipe 16, though not shown.

Now, the Ar laser beam 24 is emitted from the Ar laser beam generator 23 and directed through the window 22 to the holed and wiring-exposed portion (hereinafter referred to as the "window interior") on the wafer 7' while being converged by the laser optical system 25 and the objective lens 26. Mo can be deposited in the window interior in several seconds to several ten seconds although this deposition time also depends on the laser output. After the window interior is filled up completely, the laser beam 24 is shut off by the shutter 201 (FIG. 20), and the stage 13 is moved by a distance corresponding to a design size or a preset size by means of the controller 202 to make the paired portions to be connected (wire-exposed portions) coincident with the marker. Thereafter, the shutter 201 is opened and the window interior is filled up with Mo by the radiation of the laser beam 24.

In the case where a plurality of portions are to be connected together, the above operations are repeated, and when all the window interiors are filled up, there is made connection between the filled-up portions, that is, the formation of a line. First, positioning is made for one filled-up portion, then the stage 13 is moved along a preset path at a constant speed (e.g. 1.0 mm/min) under radiation of the laser beam 24 to form Mo line. The radiation of the laser beam 24 is continued up to the other filled-up portion while forming the Mo line, and is stopped upon reaching the other filled-up portion. In the case of forming plural lines, the above operations are repeated. These filling-up and line forming operations are carried out by ON-OFF of the laser beam 24 and the movement of the stage 13. But if the points to be connected are inputted as coordinates to the controller 202, shown in FIG. 2, in advance, these operations can be performed automatically by ordinary sequence control, numerical control, or a combination thereof, in the controller 202.

In this embodiment $Mo(CO)_6$ was used as the CVD material gas to form Mo line, but other gases may be used as metal carbonyls such as $Cr(CO)_6$, $W(CO)_6$ and $Ni(CO)_4$, halogen compounds such as $MoF_6$ and $WF_6$, and alkyl compounds such as $Al(CH_3)_3$ and $Cd(CH_3)_2$. There is no special change required in the process even in the use of these gases.

After the formation of all the lines, the valve 6' is opened to discharge $Mo(CO)_6$. After exhausting up to about 10 Torr, the gate valve 2 is opened and the wafer 7' is moved onto the sample rest 8 in the load lock chamber 1. Then, after closing of the gate valve 2, the valve 10 of the Ar gas cylinder 12 is opened to introduce Ar gas into the chamber 1 while making adjustment to keep the Ar gas pressure at several mTorr. Thereafter, the upper electrode 9 is set to ground, and a high-frequency power is applied to the sample rest 8 to produce Ar plasma, allowing the surface of the wafer 7 to be sputtered by Ar+ ions, whereby the Cr film formed as a buffer film on the wafer surface can be removed. The Mo film which has been formed by laser CVD is also scraped off its surface by sputtering, but since the Mo line is formed usually at a film thickness of 0.2 to 2 μm, there will be no problem under the condition of removing the Cr film at a thickness of several 100 to 1000 Å or so.

It has been made clear experientally that in order to improve the adhesion, it is necessary for the buffer film to have a thickness of 100 Å or more.

After completion of these processings, the wafer 7' is again moved into the main chamber 3 which is now in an exhausted state to $1 \times 10^{-7}$ Torr or so. In the chamber 3, the wafer 7' is moved again to the position just under the ion beam optical system 20 and ion beam is radiated to the portion to be cut. Processing is performed successively from upper to lower layers like the passivation film, interlaying insulating film and the wiring. When this cutting operation is over the wafer 7' is again moved to the position just under the laser optical system 25.

Thus, after formation of the connection line, the cutting is made using a converged ion beam. This is because if the cutting is made at the time of formation of the connection hole, Cr will be deposited also on the inside of the cut hole when the buffer film of Cr is formed on the whole surface in the subsequent process, and the deposited Cr may not be removed by sputtering. But this is not applied to the case where isotropic etching can be realized using assist gas or the like. Such a procedural change does not alter the gist of the present invention.

Upon completion of these processings, tetraethoxysilane, tetraethyly ortho silicate and ozone are introduced into the main chamber 3, using the valve 30 of the CVD gas cylinder 34 for the insulating film and the valve 31 of the oxygen cylinder 35. It is effective to feed this gaseous mixture to the position near the laser-applied portion through a nozzle (not shown). The gaseous mixture may be introduced into the chamber 3 until a predetermined certain pressure is obtained. Since the vapor pressure of tetraethyl ortho silicate is low, the cylinder 34 and the pipe 32 are heated to 30°-70° C. if necessary. While the interior of the chamber 3 is held at the certain pressure, or under flowing of the gaseous mixture (inevitably at this time, while exhausting is continued by the exhaust pump 4'), the Ar laser beam 24 emitted from the Ar laser generator 23 is converged and radiated to the aluminum line-cut portion on the chip (wafer) by the laser beam converging objective lens 26 through the window 22 by the same method as that used for filling up the connection hole with Mo. As a result, $SiO_2$ can be deposited in the interior of the cut portion (hole) in several seconds to several ten seconds. After the cut portion is thus convered with $SiO_2$, the laser beam 24 is shut off by a shutter (not shown), then the stage 13 is moved by a distance corresponding to a design size or a preset size, and through such successive movements all the cut portions are covered with $SiO_2$ in the same manner as above.

Next, by the same method as that used for the formation and connection of the Mo line, the stage 13 is moved at a constant speed under radiation of the laser beam 24 from the start point (connection hole) up to the end point (the other connection hole) on the Mo line, whereby the Mo line is coated with $SiO_2$ and the laser beam is again applied to the Mo line, so that the specific resistance of the Mo line is diminished. In the case where plural lines are formed, the above operations are repeated. When these processings are over, the wafer 7 is taken out to the exterior through the load lock chamber 1. In this way the required lines can be formed on the wafer; besides, the lines are covered with an insulating film. Lines intersecting the lines thus formed can be formed by repeating the above processings.

Figure 3A:
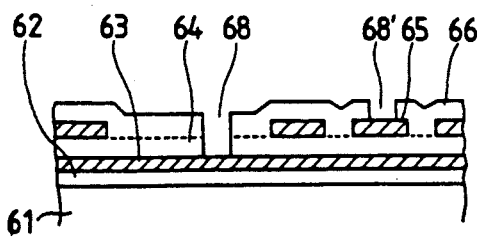
FIG. 3(a) to (h) are explanatory views of a method for modifying wiring of a semiconductor integrated circuit according to an embodiment of the present invention.

The wiring forming method of the present invention will now be described in more detail with reference to FIG. 3. FIG. 3(a) shows a sectional structure of a semiconductor integrated circuit chip which has gone through sputtering etching or the like to remove contaminants such as moisture, etc. adhered to the chip surface inn the load lock chamber 1 and subsequent processing with converged ion beam by the ion beam optical system 20 to form connection holes. More specifically, on a silicon substrate 61 there are formed, through an $SiO_2$ film, a lower aluminum line 63, an interlayer insulating film 64, an upper aluminum line 65 and a passivation film 66, and connection holes 68, 68' are formed using converged ion beam. As will be described later, a cutting hole 67 may be formed simultaneously with the formation of the connection holes 68, 68', but it is better to form it after the line formation.

Thereafter, a Cr film 82 superior in the adhesion to the passivation film 66 and having electroconductivity and also having a higher laser beam absorbability than the aluminum line surface is formed on the whole surface of the passivation film 66 at a thickness of several 100 to 1000 Å by sputtering with the upper sputtering electrode 21. Thereafter, the connection holes 68 and 68' are filled up with Mo 71 by converging and radiation of Ar laser beam 70 in a $Mo(CO)_6$ (molybdenum carbonyl) gas 69, as shown in FIG. 3(b). Then, Mo line 72 is formed by moving the chip while radiating the Ar laser beam 70 to the area between the connection holes 68 and 68', as shown in FIG. 3(c). Then, after discharge of $Mo(CO)_6$, as laser annealing for the line formed, the upper surface of the Mo line 72 is scanned in vacuo 78 again with the Ar laser beam 70, as shown in FIG. 3(d), to improve the resistance value of the Mo line 72. At this time, it is necessary to increase the laser output to two to five times the laser output used in the line formation. More specifically, after discharge of $CVD(Mo(CO)_6)$ gas 69, the chip (wafer) 7' is exposed to a vacuum atmosphere of at least $10^{-5}$ Torr. Then, the chip (wafer) 7' is shifted vertically along the optical axis so that the radiation diameter of the Ar laser beam 70 relative to the Mo film 72 becomes almost equal to the width of the film 72, and the laser beam is radiated to the Mo film 71 already deposited in one connection hole 68 to anneal the film. Then, the chip (wafer) 7' is moved and the Ar laser beam 70 is radiated for annealing up to the Mo film 71 already deposited in the other connection hole 68', including the Mo film 72. Thus, at the time of annealing according to this method, the Ar laser beam 70 is radiated in a diameter almost equal to the width of the Mo films 71, 72, so it is possible to effect annealing in a short time and uniformly. Conversely, if a converged Ar laser beam is radiated plural times, there arises a tendency to delaminate and deteriorate the Mo film 71 already deposited, and stress is apt to remain in the film itself.

The annealing according to this method brings about the following effects. The specific resistance of the Mo film already deposited is about 30 $\mu\Omega.cm$, while that of the Mo films after annealing is about 11 $\mu\Omega.cm$, and thus it is possible to attain about 40% reduction of the specific resistance. There is no great change in the geometrical shape of the Mo film before and after annealing, and hence it is possible to improve the crystallinity of the Mo film and remove impurities such as carbon and oxygen by the laser annealing.

A detailed description will now be provided about the case where Mo line is to be formed on a sample comprising a silicon wafer and a 1.85 $\mu m$ thick $SiO_2$ film formed thereon. After the interior of the chamber 13 is exhausted to $1 \times 10^{-6}$ Torr or less, Mo(CO)$_6$ gas is fed until the pressure thereof is 0.1 Torr, and this pressure is maintained. The stage was moved while the Ar laser beam emitted from the Ar laser beam generator was converged and radiated as a spot of about 3 μm through the objective lens to form an Mo line. The Mo line formed at a laser output of 200 mW and a moving speed of 1 mm/min had a film thickness of 0.25 to 0.35 μm and a line width of 8.5 to 10.0 μm, and a specific resistance thereof calculated from a resistance value determined was 25 to 30 μΩ.cm.

Figure 12:
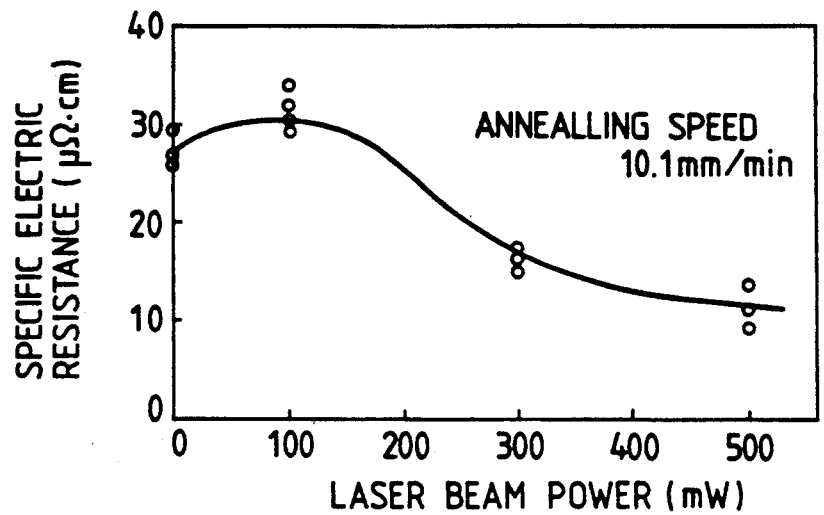
FIG. 12 is a view showing a relation between the laser power in annealing and a specific resistance of Mo line.

A large number of such lines were formed and the stage was again moved under radiation of the laser beam onto the lines in vacuum ($1 \times 10^{-6}$ Torr or less). The moving speed was kept constant at 0.1 mm/min, and the radiation of the laser beam was performed in three stages of laser outputs which were 100, 300 and 500 mW. The results are as shown in FIG. 12. As is seen from this figure, specific resistances were 30-34, 15-18 and 10-14 μΩ.cm at 100, 300 and 500 mW, respectively.

Figure 13:
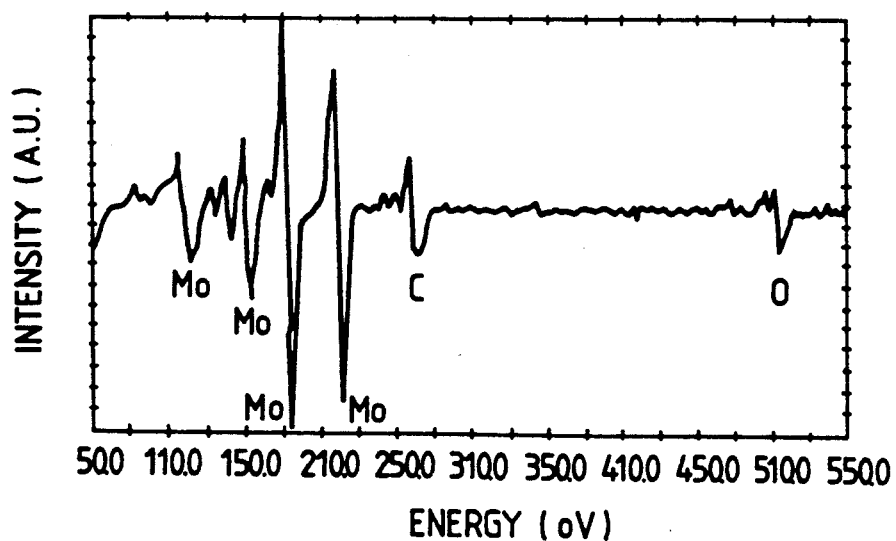
FIG. 13 is a view showing the results of Auger analysis of Mo line before annealing.
Figure 14:
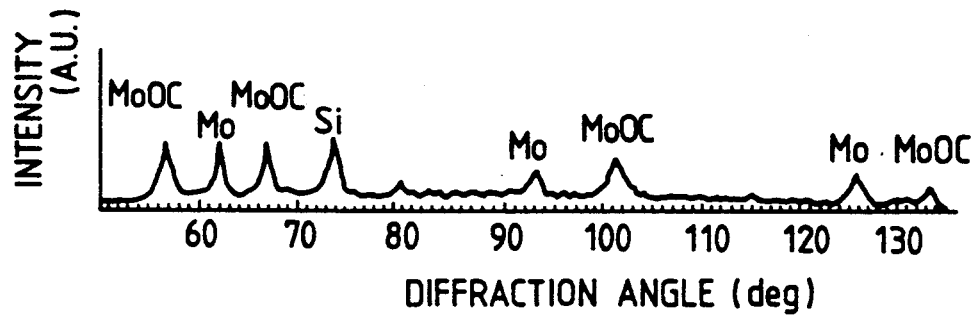
FIG. 14 is a view showing the results of X ray diffraction analysis of Mo line before annealing.
Figure 15:
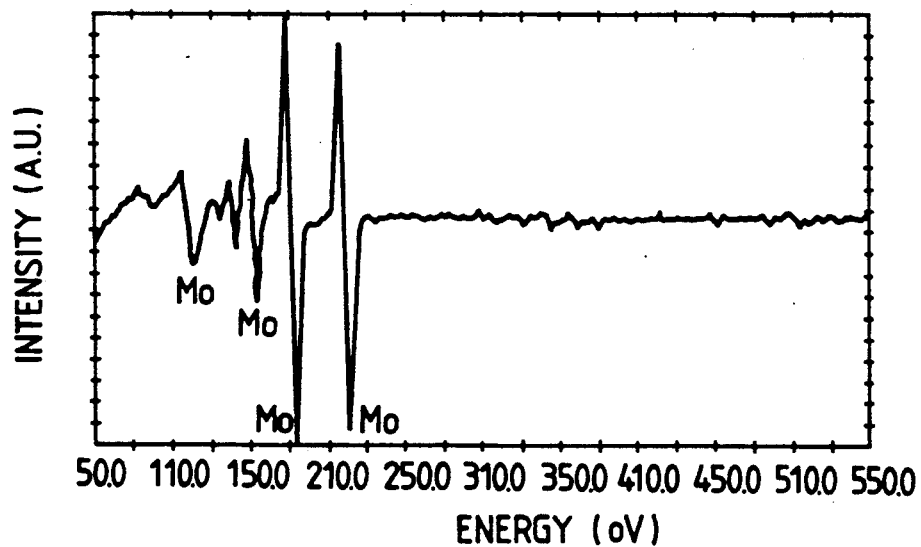
FIG. 15 is a view showing the results of Auger analysis of Mo line after annealing.
Figure 16:
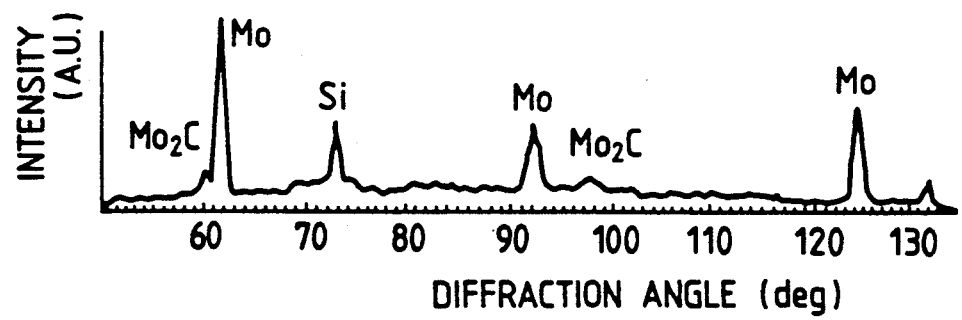
FIG. 16 is a view showing the results of X-ray diffraction analysis of Mo line after annealing.

In order to clear up the cause of such change in specific resistance, unannealed line and annealed line at 500 mW were each subjected to micro-Auger spectroscopic analysis and X-ray diffraction analysis. The results of the Auger spectroscopic analysis of the unannealed line and that of the x-ray diffraction analysis are shown in FIGS. 13 and 14, respectively. It is seen from FIG. 13 that the unannealed line is composed of Mo, C and O and also seen from FIG. 14 that those elements have a structure of metal Mo and MoOC (molybdenum oxycarbide). On the other hand, the results of the Auger spectroscopic analysis and that of the X-ray diffraction analysis of the 500 mW annealed line are shown in FIGS. 15 and 16, respectively. It is seen from FIG. 15 that the line after annealing is constituted by Mo alone and that the other elements are below noise level, and also seen from FIG. 16 that Mo is metal Mo and that as to the other elements there are merely recognized extremely weak peaks of Mo$_2$C (molybednum carbide). These results show that the line formed by laser CVD is a mixture of Mo and MoOC and that by the laser annealing in vacuum MoOC is decomposed and most of C and O are removed, with C slightly remaining in the form of Mo$_2$C. That is, the reduction of the specific resistance by the laser annealing is due to the increase in the proportion of the metal Mo in the line.

Figure 17:
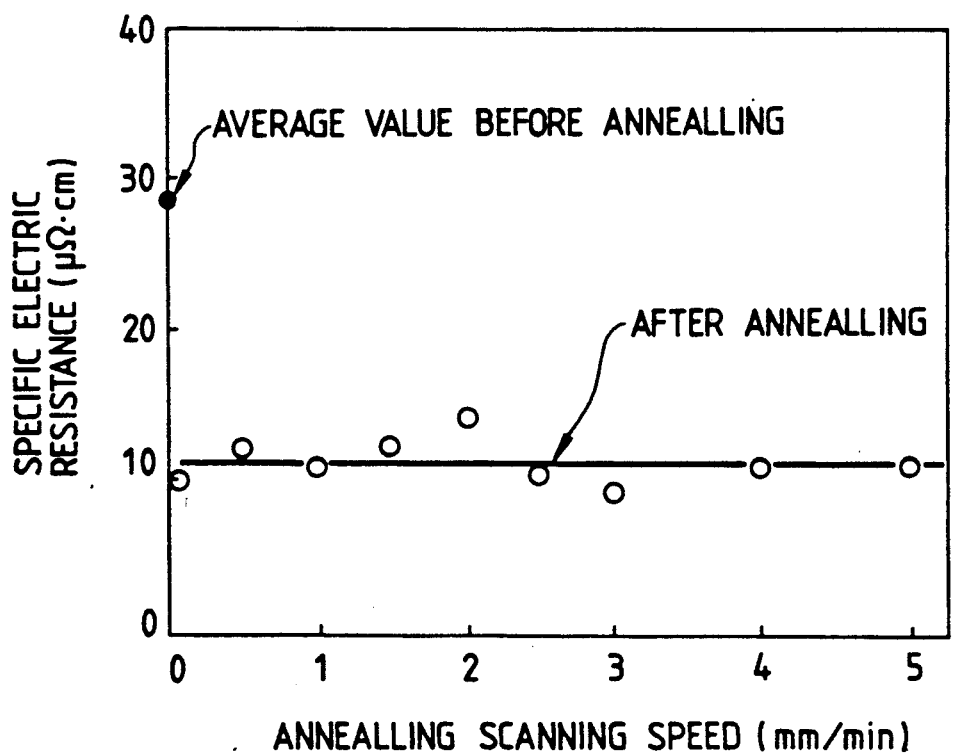
FIG. 17 is a view showing a relation between a laser beam scanning speed in annealing and a specific resistance of Mo line.

Also, the dependence of the effect of the laser annealing on the scanning speed was checked. The laser output in annealing was kept constant at 500 mW, while the stage moving speed was changed in the range of 0.1 to 5.0 mm/min, and annealing was performed under these conditions. The resulting values of specific resistance are as shown in FIG. 17. From the results set forth therein it is seen that an average value of specific resistance before the annealing was 28 μΩ.cm, while the specific resistance after the annealing was reduced to half or less, ranging from 10 to 14 μΩ.cm independently of the scanning speed in the scanning speed range of 0.1 to 5.0 mm/min.

In this experiment, an Mo line having a width of about 9 μm was formed using a laser beam spot of about 3 μm in diameter, and the annealing was conducted using a converged laser beam spot of the same diameter. As a result, the portion where the laser beam spot had passed was somewhat enhanced in its metallic luster over a width of about 5 μm, and it could be confirmed also from the appearance that the said portion had been annealed. At the laser output of 700 mW in the annealing, the Mo line was damaged intermittently at the center of the laser beam spot, and it turned out that the Mo line was not employable practically. It also turned out that approximately the whole of the line could be annealed by the radiation of the laser beam in a somewhat deviated state from a focal position (for example, by the radiation at a converged beam diameter of about 6 μm).

As noted above, the specific resistance can be reduced by annealing the line formed by laser CVD under the radiation of laser beam again in vacuum. That is, a low resistance line can be formed.

Next, lines were formed by laser CVD on an LSI chip comprising a silicon wafer, three layers of aluminum lines, interlayer insulating films and a final protective film in a total thickness of 6 μm. The line forming conditions involved an Mo(CO)$_6$ gas pressure of 0.1 Torr, a constant stage moving speed of 15 μm/sec (0.9 mm/min), and three stages of laser output which were 100, 150 and 200 mW. Because LSI chip has an infinite number of uneven spots on the surface thereof with the presence of the aluminum line on the lower layer, it is difficult to measure a cross sectional area of Mo line. Line resistance per unit length was measured. The line resistance immediately after the formation were 77 Ω/mm, 45 Ω/mm and 28 Ω/mm at the laser outputs of 100 mW, 150 mW and 200 mW, respectively.

A line was formed on another chip at the same conditions so that laser annealing was applied to the line at the anneal laser output of 400 mW and the scanning speed of 20 μm/sec (1.2 mm/min). As a result, the lines formed at the outputs of 100 mW, 150 mW and 200 mW had line resistances of 39 Ω/mm, 30 Ω/mm and 21 Ω/mm after annealing, respectively.

It is found that the lower the laser output during line formation, the more remarkable the reduction of line resistance through annealing at the same conditions. In order to evaluate the reliability of these lines, a temperature cycle test was carried out to a chip which has lines formed thereon. Temperature changes ranging from −50° C. to +150° C. are imposed in the temperature cycle.

Figure 18:
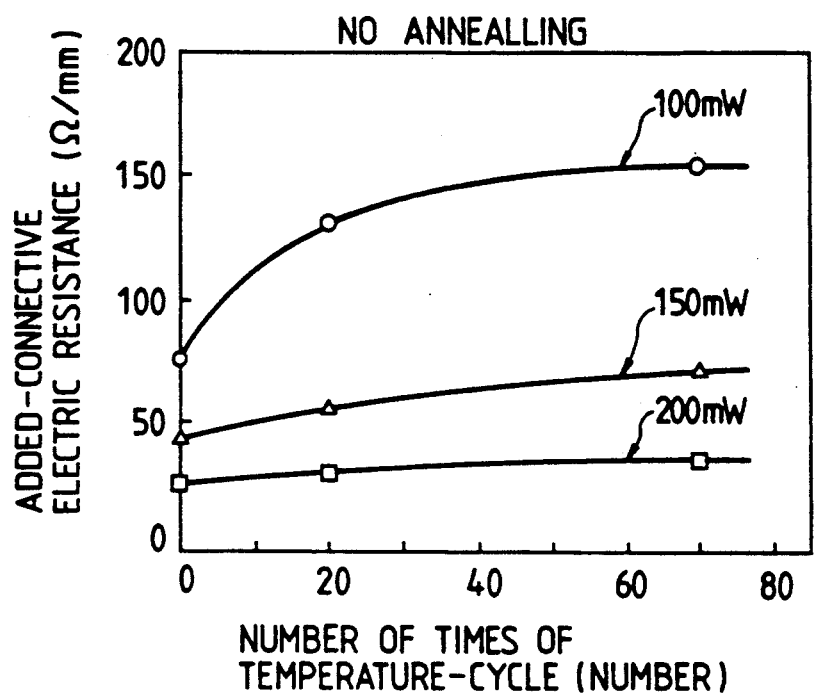
FIG. 18 is a view showing changes in resistance value based on temperature cycles of Mo lines before annealing.

FIG. 18 shows results of the temperature cycle test for lines without laser annealing. After seventy temperature cycles, the lines formed at the laser outputs of 100, 150 and 200 mW were increased in line resistances to 150, 65 and 35 Ω/mm, respectively. Thus, the lower the laser output power, the larger the increase in line resistance.

Figure 19:
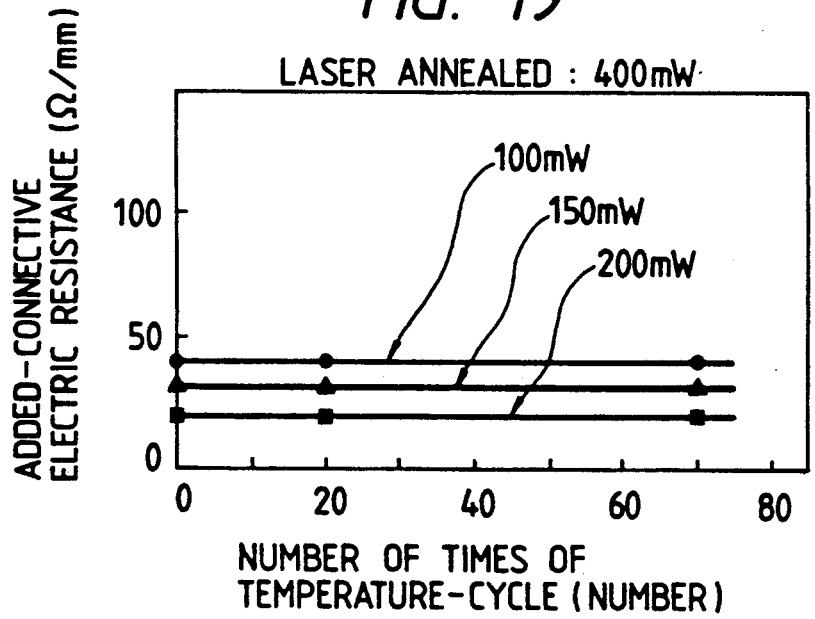
FIG. 19 is a view showing changes in resistance value based on temperature cycles of Mo lines after annealing.

On the other hand, a line annealed at a laser power of 400 mW exhibited only a slight change in its resistance, falling under a rated variation range, even after seventy temperature cycles, as shown in FIG. 19. It is presumed that there was no effective change in the line resistance.

Thus, the lines formed at high powers are smaller in the reduction percentage of resistance value after laser annealing and smaller in the percentage of increase of resistance value based on temperature cycle. This is because the deposited line film is heated sufficiently by the radiation of sufficient power at the time of the line formation and so there is obtained the same result as that obtained by partial annealing with the laser beam, that is, the line has a high proportion of metal Mo.

On the other hand, the lines formed at low powers are larger in the reduction percentage of resistance value after laser annealing and larger in the percentage of increase of resistance value based on temperature cycle before annealing. This is because the proportion of MoOC in the lines is large due to their formation at low powers.

It is desirable that the laser annealing be carried out by heating the whole of the line formed. And it is necessary to take some measure so as not to radiate the other portion of the wiring portion because the annealing is performed at a high power density as compared with that in the line formation. When the expansion of the annealed area due to thermal conduction is considered, it will be optimal to make annealing under the radiation of laser beam over an area narrower by 2 to 4 $\mu$m than the line width.

Thus, lines of high reliability can be formed by laser annealing independently of line forming conditions.

Figure 3E:
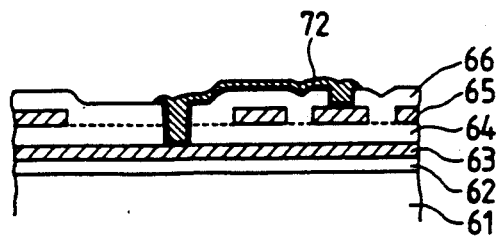
Figure 3B:
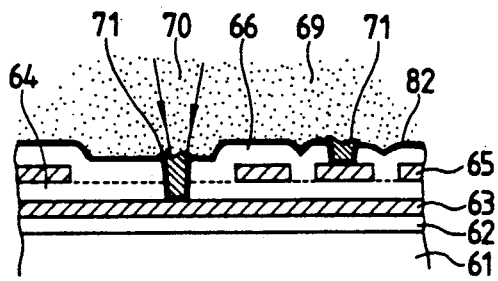
Figure 3F:
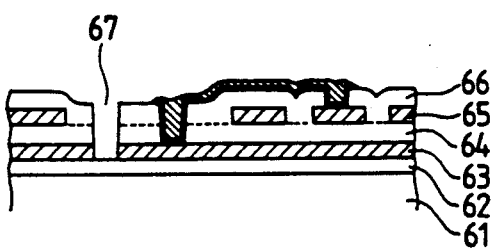
Figure 3C:
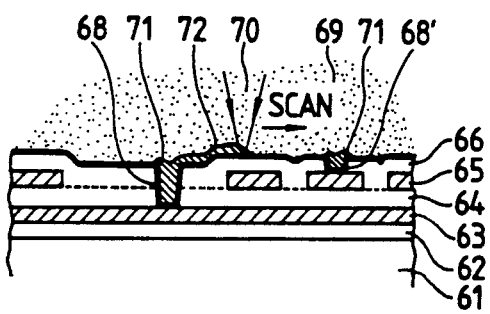
Figure 3G:
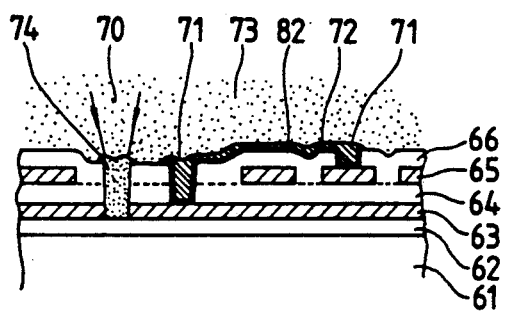
Figure 3D:
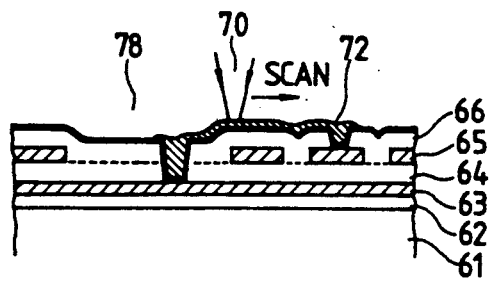

Thereafter, the Cr film 82 as a buffer film formed on the chip surface is removed by sputtering etching in the load lock chamber 1 to obtain the state shown in FIG. 3(e). Next, a cutting hole 67 is formed by the radiation of converged ion beam, followed by line cutting, to obtain the state shown in FIG. 3(f). Then, the Ar laser beam 70 is applied to the cut portion in an atmosphere 73 of TEOS and ozone, and the cutting hole 67 is filled up with $SiO_2$, as shown in FIG. 3(g). Next, to form a protective film for the line, the upper surface of the Mo line 72 is scanned with the laser beam 70 in the TEOS and ozone atmosphere 73, whereby only the Mo line 72 can be covered with $SiO_2$ film 75, as shown in FIG. 3(h).

Figure 3H:
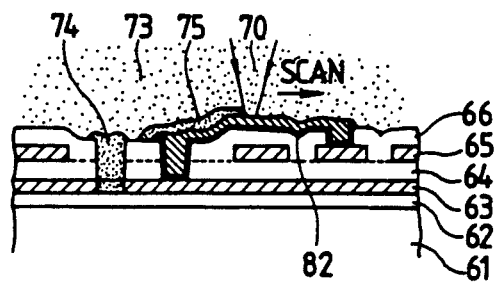

The process (improvement of the film quality) shown in FIG. 3(d) and the process (formation of the insulating film) shown in FIG. 3(h) can be carried out consecutively. In this case, the process shown in FIG. 3(d) can be omitted; that is, the film quality of the Mo line 72 can be improved at the time of forming the $SiO_2$ film 75 under the radiation of laser beam in an atmosphere of TEOS.

Figure 4A:
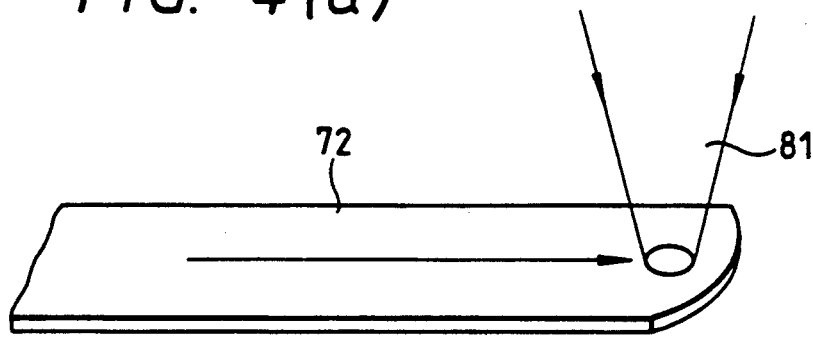
FIGS. 4(a) to (c) are explanatory views for the improvement in the wiring film quality and for the formation of an insulating film.

A further explanation will now be made about the improvement in film quality and the formation of insulating film. For example, in the case where the Ar laser beam 24 is radiated to the chip in an atmosphere of $Mo(CO)_6$ and at the same time is moved while being converged to 3 $\mu$m or so in diameter through the objective lens, the heated area expands due to heat conduction as shown in FIG. 4(a) though the expansion also depends on the laser output, $Mo(CO)_6$ gas pressure, moving speed and the sectional structure of the chip, so that there can be formed Mo lines 72 having widths of 5-10 $\mu$m and 10-15 $\mu$m at laser outputs of 100 and 200 mW, respectively. In this connection, it has been known that when a laser beam 81 converged to 3 $\mu$m or so in diameter is radiated to the Mo line 72 about 10 $\mu$m in width while being moved in the line direction, the film quality can be improved only over a width of 5 to 7 $\mu$m; it is not that the improvement can be made throughout the whole width. Also in the case where an insulating film is to be formed on the line, if a laser beam converged to 3 $\mu$m or so in diameter is radiated to the center of the line and at the same time is moved in the line direction, the thickness of the insulating film is small because the end portion of the line is not directly heated by the laser beam.

Figure 4B:
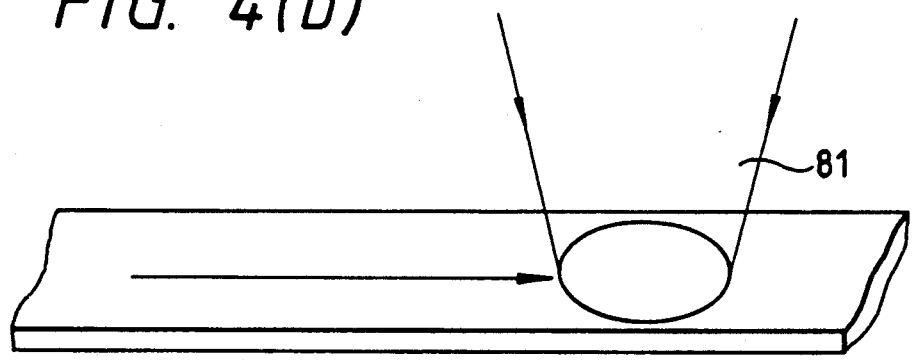
Figure 4C:
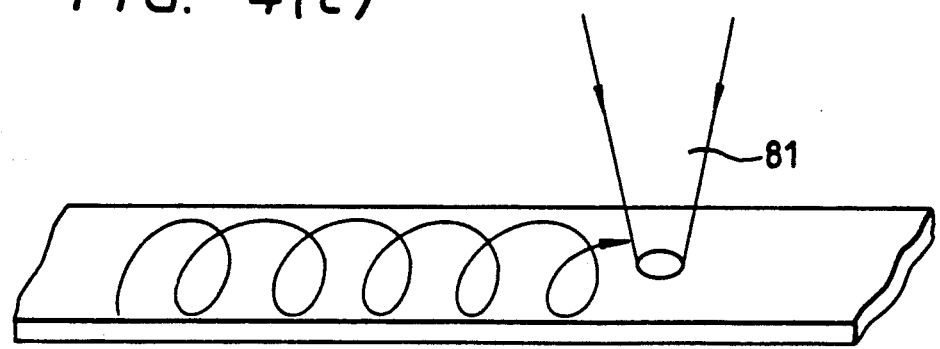
Figure 5:
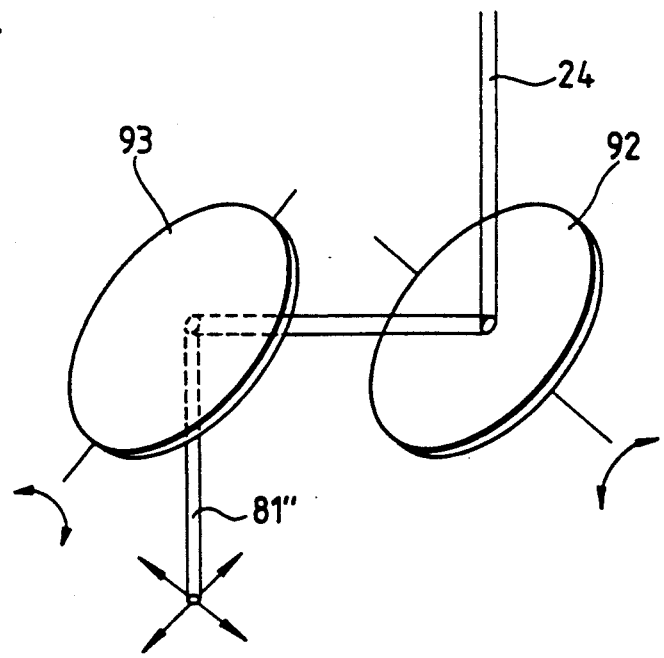
FIGS. 5 and 6 are explanatory views of laser beam scanning.
Figure 6:
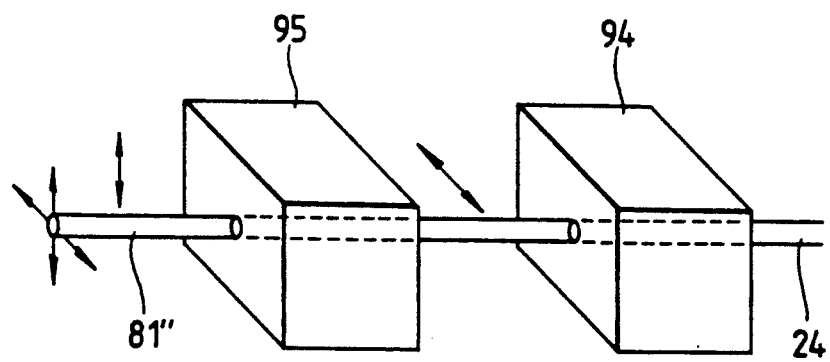

This problem can be solved by expanding the converged diameter of laser beam 81' to about the same degree as the line width, as shown in FIG. 4(b), or by moving laser beam 81" in the line direction while scanning it also in the width direction of the line 82, as shown in FIG. 4(c). In the case of expanding the converged beam diameter, the laser output is increased if necessary. For scanning of the laser beam 81" in the width direction there is used, for example, such a laser optical system as shown in FIG. 5 or FIG. 6. More specifically, as shown in FIG. 5, X-Y scanning of the laser beam 24 can be effected by slightly rotating two galvanometers 92 and 93 about orthogonal axes respectively. The object can be attained by scanning the laser beam in a direction perpendicular to the moving direction of the stage or by synchronized oscillation of both axes to create circular motions and moving the stage in this state. Also, as shown in FIG. 6, the laser beam 24 can be scanned in the X-Y direction by deflectors 94 and 95 which utilize an electro-optical effect and which are disposed so that the respective deflecting directions are perpendicular to each other. The object can be achieved thereby.

Figure 7:
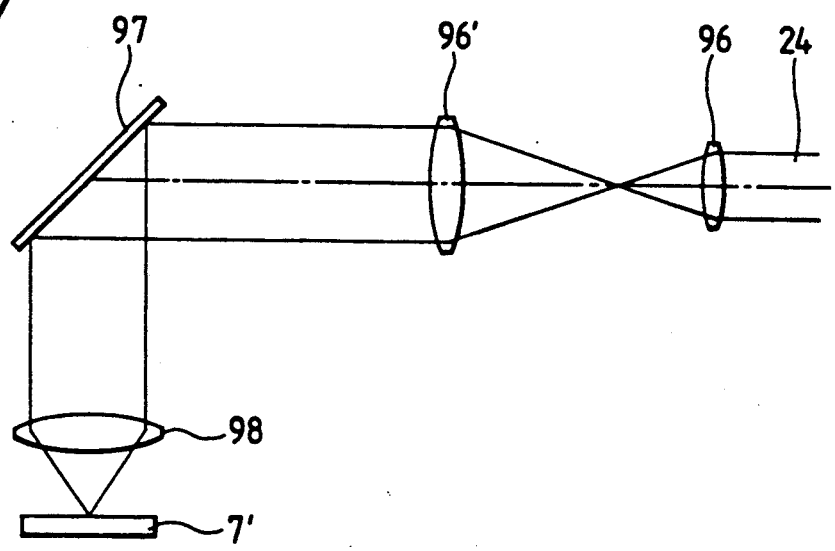
FIG. 7 is a view explanatory of changing the diameter of a laser beam spot.

Further, the object of expanding the spot diameter of the laser beam 81" can be attained by moving one of lenses 96 and 96' which constitute a beam expander, in the optical axis direction, as shown in FIG. 7. More specifically, in the case where the laser beam 24 is bent 90° by a mirror 97, then converged by an objective lens 98 and applied onto the wafer 7', the formation of the line and the filling-up of a hole are performed when the focal position of the objective lens and the sample surface are coincident with a positional relation in which the beam is emitted as a collimated beam by the beam expander, and the position of the lens 96 is moved to shift the focal position in the optical axis direction (defocusing) and eventually expand the spot diameter, thereby improving the film quality of the Mo line 72 and forming the $SiO_2$ film 75. Other than the method of shifting the position of a constituent lens of the beam expander, there also may be adopted a method involving the insertion of a long focus lens, or the insertion of a transparent plate between the objective lens and the sample. Also in this case there can be obtained the same effect as above.

In the above embodiment there was used the wiring modifying apparatus illustrated in FIG. 1, which apparatus permits all of cutting of lines, forming of connection holes, filling-up of the holes with an electroconductive material, forming of lines, and forming of an insulating film. However, the present invention is not limited to this apparatus. It is apparent that these processes may be carried out by using a separate apparatus if only after the modification of lines, including cutting of lines or forming of additional lines, the modified portions go through the covering process with an insulating film.

In the processes shown in FIG. 3, the process sequence may be changed, such as first forming only the connection holes, filling up the holes with Mo to form the Mo line, thereafter cutting the line. Such a modification is also included in the scope of the present invention as long as it does not depart from the gist of the present invention.

Another application of the present invention will now be described with reference to FIG. 8. According to this application, in a portion where the upper and lower lines 65, 63 overlap each other, it is intended to make connection to the lower line 63 without short-circuiting with the upper line 65. In FIG. 8(a) there is illustrated a semiconductor integrated circuit comprising a silicon base 61 and the following components formed thereon through a silicon dioxide film 62-a lower aluminum line 63, an interlayer insulating film 64, an upper aluminum line 65 and a passivation film 66-.

First, a connection hole 107 is formed in the passivation film 66 and the upper aluminum line 65 so that the interlayer insulating film 63 is exposed, and SiO₂ 108 is embedded in the inside of the hole 107, as shown in FIG. 8(c). Thereafter, as shown in FIG. 8(d), a connection hole 107' is formed so that the upper aluminum line 65 is not exposed, allowing the lower aluminum line 63 to be exposed. Next, as shown in FIG. 8(e), the connection hole 107' is filled up with Mo to form Mo lines 71 and 72, and connection is made to the portion requiring connection. Thereafter, if necessary, SiO₂ film is formed on the Mo line 72 for the protection and insulation of the same line. These processes are just the same in principle and means as the processes illustrated in FIG. 3. It goes without saying that the improvement in adhesion can be attained by the formation of Cr film before embedding of Mo and forming Mo line. And unnecessary Cr film portion is removed by suitable means, e.g. sputtering etching.

Figure 9A:
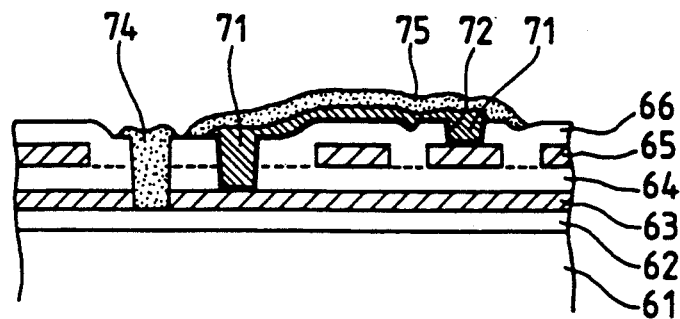
Figure 9B:
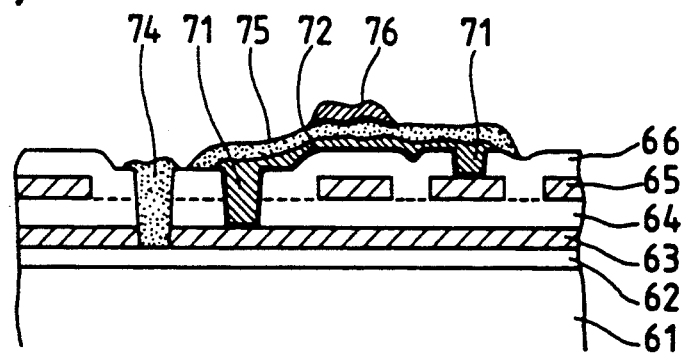
Figure 9C:
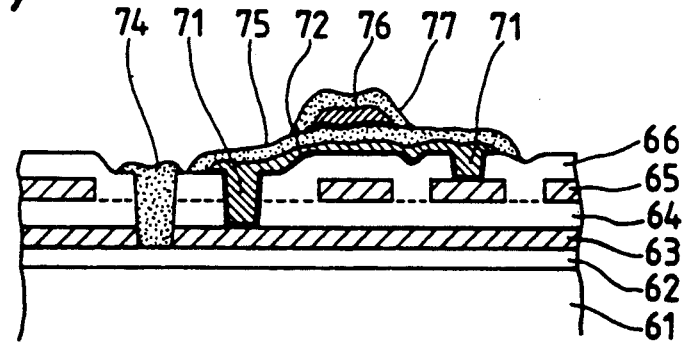

Another application of the present invention is shown in FIG. 9. FIG. 9(a) illustrates the section of the semiconductor device which has gone through the processes of cutting and formation of the connecting Mo line 72 shown in FIG. 3. On the Mo line 73 there is formed the SiO₂ film 75 as a protective film, which is used here as an interlayer insulating film. More specifically, on the Mo line 72 there is formed an Mo line which intersects the line 72, as shown in FIG. 9(b). If necessary, an SiO₂ film 77 may be formed on the Mo line 76, as shown in FIG. 9(c). For improving the adhesion, a buffer film (Cr film) may be formed prior to the formation of the Mo line 76. In this case, it becomes necessary to provide a process for removing the buffer film after the formation of the Mo line.

Figure 10:
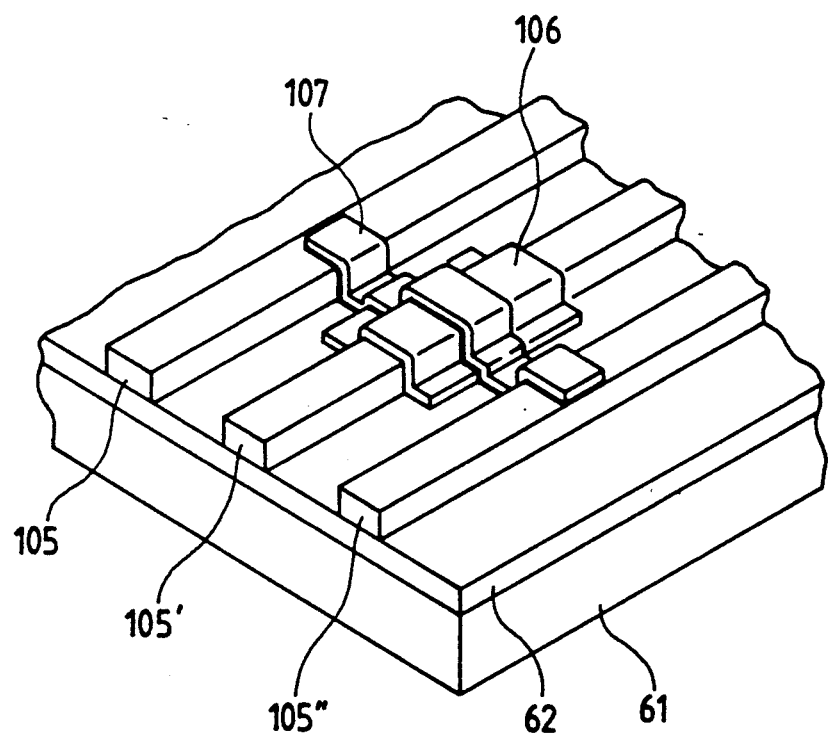

In the embodiment illustrated in FIG. 9, there is formed an interlayer insulating film to prevent short-circuiting of the lines formed by laser CVD. This is also applicable to the case where the interlayer insulating film is formed on the chip before formation thereon of the passivation film. More specifically, as shown in FIG. 10, aluminum lines 105, 105' and 105" are formed on the silicon substrate 62 through SiO₂ film 62. These aluminum lines are exposed. For example, if a connection line 107 is formed by laser CVD between the aluminum lines 105 and 105", there inevitably occurs short-circuiting with the line 105'. This can be prevented by forming an interlayer insulating film 106 on the aluminum line 105' by laser CVD prior to formation of the connection line 107.

Although in FIG. 10 the SiO₂ film 106 is formed locally, it may be formed over a wider area. In this case, it is necessary to form connection holes using a converged ion beam as in the chip having a passivation film formed thereon.

It goes without saying that high reliability is ensured by covering the connection line 107 thus formed with SiO₂.

Figure 11:
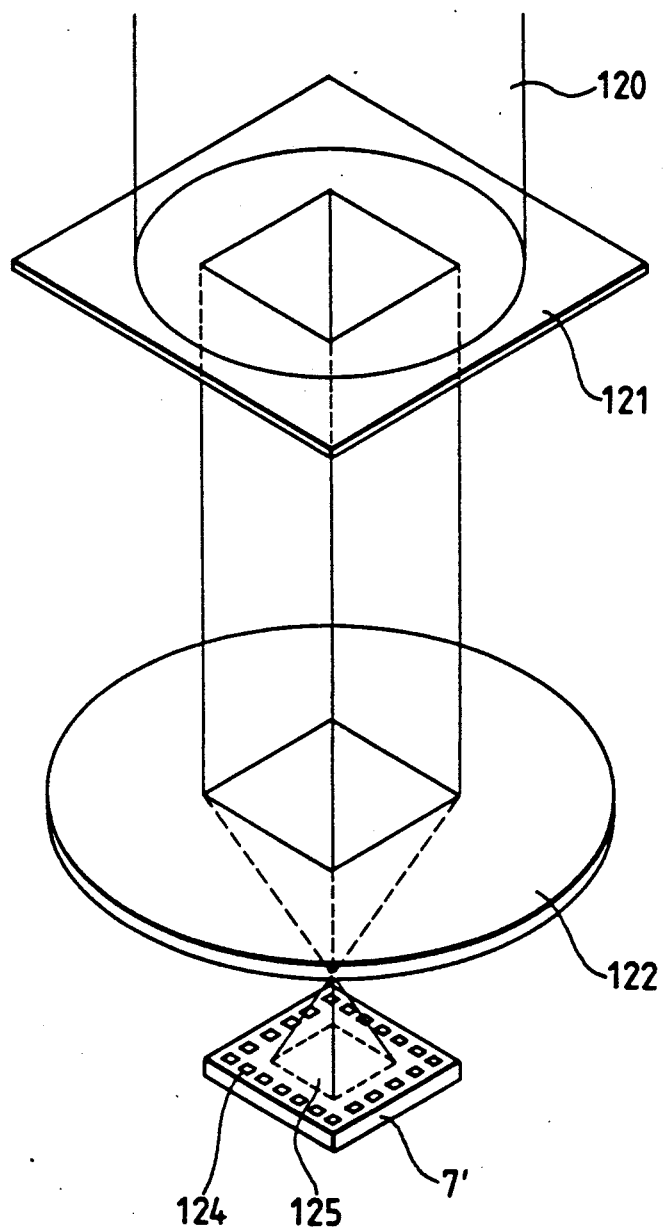
FIG. 11 is a perspective view showing a method for projective radiation of laser beam onto a semiconductor chip according to the present invention.

Referring now to FIG. 11, there is illustrated a further embodiment. Although in the previous embodiment the cut portion and the additional line were covered with SiO₂ film, in this embodiment the SiO₂ film is formed throughout the whole of the modified portion.

More specifically, as shown in FIG. 11, the laser beam 120 is shaped through a mask 121, which is formed to transmit the laser beam 121 through only a required portion and which is disposed in a position so that the image of the mask 121 is projected onto the semiconductor chip 7' by an objective lens 122. Usually, on the semiconductor chip 7' there are formed pads 124 serving as electrodes for the supply of electric power and also for the input and output of signals. It is necessary to avoid forming SiO₂ film thereon. Though omitted in FIG. 11, the chip 7' is placed in an atmosphere of a gaseous mixture of TEOS and ozone within the chamber, and the laser beam 120 is radiated through a beam transmitting window. The laser beam 120 is not specially limited. There may be used Ar laser generated by continuous oscillation or pulse oscillation, fundamental wave of YAG laser and higher harmonic thereof, $CO_2$ laser, and any other laser beam if it can heat the chip surface. The laser output is adjusted to avoid damage to the aluminum lines, etc. formed in the chip.

According to this method, in the other portion than the modified portion there is further formed SiO₂ film on the passivation film, but this will cause no problem with respect to the characteristics of the chip 7'.

Although in the embodiments described above there was used only the laser CVD for the formation of connection lines, the lines can also be formed by radiating a converged ion beam or electron beam onto the chip which is placed in a CVD gas atmosphere, and the lines thus formed can be covered with an insulating film by the radiation of electron beam in a CVD gas atmosphere for the formation of an insulating film. Further, by the radiation of the beam simultaneously with or before the formation of the insulating film, it is possible to improve the quality of the line film.

According to the present invention, as set forth hereinabove, the wiring-modified portion can then be covered with an insulating film, there can be obtained the following effects: ① there is no fear of short-circuiting caused by migration for example in the cut portions of aluminum lines; ② it is possible to prevent connection lines from being broken by a mechanical force for example; ③ it is possible to prevent short-circuiting of crossing connection lines; and ④ it is also possible to prevent short-circuiting with the internal wiring of the semiconductor device. Thus, the semiconductor device, after the modification of wiring, can be improved in reliability. According to the present invention, moreover, since the buffer film is present, it is possible to form lines at a low laser output, reducing damage to lower layers, and at the same time it is possible to improve the adhesion of wiring. Besides, it is possible to diminish the thermal influence on the LSI chip. With the laser annealing the amount of time for a wiring change is lowered, and the wiring resistance is lowered. According to the present invention, moreover, it is possible to form an insulating film superior in the area covered by the wiring using the CVD method using TEOS for example.

Thus, according to the present invention there is obtained a semiconductor device of high reliability, and the semiconductor devices which have been modified by the method of the present invention can be shipped as though they are products, thus permitting great shortening of the period for development.

I claim:

1. A method for modifying wiring of a semiconductor device having a multilayer interconnection on a semiconductor substrate, including the steps of:
   forming a plurality of fine holes through an insulating film by irradiation with a converged energy beam to selected internal lines in the semiconductor device to expose said selected internal lines;

sputtering a thin buffer film less than 1000 Å thick on an upper surface of the insulating film and in said fine holes;

forming an additional connection line along a narrow preselected path on said buffer film by energy beam CVD of at lest one of molybdenum, tungsten, and aluminum to interconnect said selected internal lines;

annealing said additional connection line by radiating an energy beam thereon to reduce the resistance of the additional connection line; and forming an insulating film at least on said additional connection line by energy beam CVD to cover the additional connection line with said insulating film.

2. A method for modifying wiring of a semiconductor device according to claim 1, in which the step of forming a fine hole includes cutting through at least one internal line as well as through an insulating film to said selected internal line, by radiating with the converged energy beam, and further including an insulating film forming process in which at least one edge face of the other internal line exposed by cutting said fine hole therethrough is covered with an insulating film formed by energy beam CVD to prevent short-circuiting of said other internal line to the additional connection line.

3. A method for modifying wiring of a semiconductor device according to claim 1, wherein the converged energy beam is a converged ion beam.

4. A method for modifying wiring of a semiconductor device according to claim 1, wherein the energy beam is a laser beam.

5. A method for modifying wiring of a semiconductor device according to claim 1, wherein the addition connection line forming energy beam CVD includes laser beam CVD to form said additional connection line.

6. A method for modifying wiring of a semiconductor device according to claim 1, wherein in the insulating film forming step said energy beam CVD is a laser beam CVD.

7. A method for modifying wiring of an LSI semiconductor device having a multilayer interconnection on a semiconductor substrate, including the steps of:

forming a plurality of fine holes through an insulating film to expose selected internal lines in the semiconductor device;

sputtering a thin buffer film less than 1000 Å thick over an upper surface of the insulating film and in said fine holes;

forming an additional connection line on said buffer film by energy beam CVD only along a preselected narrow path that interconnects at least two of the fine holes;

etching the buffer film and the additional connection line until an exposed portion of said buffer film is removed;

reducing the resistance of the additional connection line by annealing said additional connection line; and forming an insulating film at least on said additional connection line to cover the additional connection line with an insulating film.

8. A method for modifying wiring of a semiconductor device having a multilayer interconnection on a semiconductor substrate, the method including:

forming a plurality of fine holes through an insulating film by radiation of a converged ion beam to at least two internal lines in the semiconductor device to expose said internal lines;

sputtering a thin buffer film less than 1000 Å including at least one of chromium, titanium, titanium nitride, and tungsten an upper surface of the insulating film and in said fine holes;

depositing an additional connection line in and between said fine holes along a preselected path on said buffer film with energy beam CVD including at least one of molybdenum, tungsten, and aluminum to interconnect electrically said at least two internal lines;

removing an exposed buffer film portion adjacent the additional connection line along the preselected path;

annealing said additional connection line to reduce the resistance thereof by radiating an energy beam on the additional connection line in one of (i) a vacuum, (ii) an atmosphere of an inert gas, and (iii) a reducing gas; and forming another insulating film at least on said additional connection line with an energy beam CVD to cover the additional connection line with said other insulating film.

9. A method for modifying wiring of a semiconductor device according to claim 8, wherein said annealing process and said insulating film forming steps are carried out simultaneously.

10. A method for modifying wiring of a semiconductor device according to claim 9, wherein, in said insulating film forming step, tetraethyl ortho silicate gas and ozone gas are used to a silicon dioxide insulating film by laser CVD.

11. A method for modifying wiring of a semiconductor device according to claim 8 wherein the fine hole forming step including cutting through an internal line portion exposing an end face thereof and further including forming an insulation film on the exposed end face of the internal line portion to prevent short-circuiting.

12. A method for modifying wiring of a semiconductor device according to claim 11, wherein said insulating film forming step includes laser beam CVD.

13. A method for modifying wiring of a semiconductor device according to claim 8, wherein the energy beam in said annealing step is a laser beam.

14. A method for modifying wiring of a semiconductor device according to claim 8, wherein the energy beam CVD in said additional connection line forming step includes a laser beam CVD.

15. A method for modifying wiring of a semiconductor device according to claim 8, wherein said insulating film forming step includes laser beam CVD.

16. A method for modifying wiring of a semiconductor device according to claim 8, wherein a laser beam is used as the energy beam in said annealing process, wherein a laser beam CVD is used as the energy beam CVD in said insulating film forming process, and wherein said annealing process and said insulating film forming process are carried out simultaneously.

17. A method for modifying wiring of a semiconductor device according to claim 8, wherein, in said insulating film forming step, tetraethyl ortho silicate gas and ozone gas are used to form a silicon dioxide insulating film with a laser beam CVD.

18. A method for modifying electron flow paths of a semiconductor device which has internal electron carrying lines embedded between semiconductor layers, the method comprising:

forming at least first and second holes through at least one insulation layer to expose preselected first and second internal lines;

forming a thin buffer film through a mask along a path from the exposed first internal line along a surface of the insulating layer and through the first and second fine holes to the second exposed internal line;

forming an electrical connection line on the thin buffer film electrically interconnecting the first and second exposed internal lines;

covering at least exposed portions of the internal lines and the additional electrical connection line with an insulating layer.

19. The method as set forth in claim 18 wherein the hole forming step includes boring the first and second holes with a focused high energy electron beam.

* * * * *